(12) United States Patent
Hughes et al.

(10) Patent No.: US 10,010,008 B2
(45) Date of Patent: Jun. 26, 2018

(54) SLED MOUNTED PROCESSING NODES FOR AN INFORMATION HANDLING SYSTEM

(71) Applicant: DELL PRODUCTS, L.P., Round Rock, TX (US)

(72) Inventors: Kevin A. Hughes, Cedar Park, TX (US); Jason G. Pearce, Round Rock, TX (US); Jonathan F. Lewis, Plugerville, TX (US); Kevin E. Locklear, Georgetown, TX (US); Curtis D. Bunch, Austin, TX (US)

(73) Assignee: Dell Products, L.P., Round Rock, TX (US)

(*) Notice: Subject to any disclaimer, the term of this patent is extended or adjusted under 35 U.S.C. 154(b) by 0 days. days.

(21) Appl. No.: 15/195,984

(22) Filed: Jun. 28, 2016

(65) Prior Publication Data

US 2017/0374768 A1   Dec. 28, 2017

(51) Int. Cl.
*H05K 7/20* (2006.01)
*H05K 7/14* (2006.01)
*H01L 23/473* (2006.01)

(52) U.S. Cl.
CPC ......... *H05K 7/1489* (2013.01); *H05K 7/1487* (2013.01); *H05K 7/20727* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 5,654,873 | A | * | 8/1997 | Smithson ................ G06F 1/181 361/679.37 |
| 7,768,783 | B1 | * | 8/2010 | Kajiya ............... H05K 7/20809 165/104.26 |
| 2005/0270751 | A1 | | 12/2005 | Coglitore et al. |
| 2007/0230148 | A1 | | 10/2007 | Campini et al. |
| 2007/0293137 | A1 | * | 12/2007 | Crippen .................... G06F 1/20 454/184 |
| 2008/0043405 | A1 | * | 2/2008 | Lee ........................ G06F 1/185 361/600 |

(Continued)

*Primary Examiner* — Anthony Haughton
*Assistant Examiner* — Razmeen Gafur
(74) *Attorney, Agent, or Firm* — Isidore PLLC

(57) ABSTRACT

A sled mounted processing node apparatus includes a first processing node sled. A first printed circuit board (PCB) is coupled to the processing node sled. Electronic components, including at least one processor, are coupled to the PCB. The apparatus includes a second processing node sled having a second PCB connected to the second processing node sled and a second set of electronic components, including at least one second processor, coupled to the second PCB. The at least one processor and second processor collectively enables increased processing density within a single server chassis. Each processing node sled is configured to be slideably inserted and removed from a server chassis that accommodates concurrent insertion of multiple processing node sleds in respective sled bays of the server chassis.

20 Claims, 10 Drawing Sheets

(56) References Cited

U.S. PATENT DOCUMENTS

| | | | |
|---|---|---|---|
| 2008/0315985 A1 | 12/2008 | Johnsen et al. | |
| 2009/0097200 A1* | 4/2009 | Sharma | G06F 1/18 361/688 |
| 2010/0110628 A1* | 5/2010 | Barrenechea | G06F 1/183 361/679.48 |
| 2012/0120596 A1 | 5/2012 | Bechtolsheim | |
| 2012/0281365 A1* | 11/2012 | Lima | H05K 7/20418 361/720 |
| 2013/0155599 A1* | 6/2013 | Ross | G06F 1/187 361/679.31 |
| 2013/0194750 A1* | 8/2013 | Dunwoody | H05K 7/20781 361/702 |
| 2013/0208420 A1* | 8/2013 | Franklin | H05K 7/1488 361/695 |
| 2013/0265725 A1* | 10/2013 | Harvilchuck | G06F 1/181 361/720 |
| 2013/0342996 A1* | 12/2013 | Fricker | H05K 7/1441 361/695 |
| 2014/0098492 A1* | 4/2014 | Lam | H05K 7/20727 361/692 |
| 2014/0301037 A1* | 10/2014 | Best | H05K 7/20781 361/679.53 |
| 2014/0313669 A1* | 10/2014 | Babish | H01L 23/473 361/699 |
| 2014/0362533 A1* | 12/2014 | Shin | H05K 7/2039 361/707 |
| 2014/0364048 A1* | 12/2014 | Milligan | H05K 7/20736 454/184 |
| 2015/0009624 A1* | 1/2015 | Dunwoody | F28F 9/007 361/688 |
| 2015/0036287 A1* | 2/2015 | Ross | G06F 1/20 361/679.48 |
| 2015/0070848 A1* | 3/2015 | Zemke | H05K 7/2039 361/720 |
| 2015/0181757 A1* | 6/2015 | Wright | H01R 13/502 361/695 |
| 2015/0195943 A1* | 7/2015 | Fricker | H05K 7/1409 361/679.58 |
| 2015/0227179 A1* | 8/2015 | Russette | G11B 33/128 361/679.31 |
| 2015/0355848 A1 | 12/2015 | Hayes et al. | |
| 2015/0373881 A1* | 12/2015 | Ross | H05K 7/20727 361/679.51 |
| 2016/0087886 A1 | 3/2016 | Hughes et al. | |
| 2016/0209868 A1* | 7/2016 | Hartman | G06F 1/16 |

\* cited by examiner

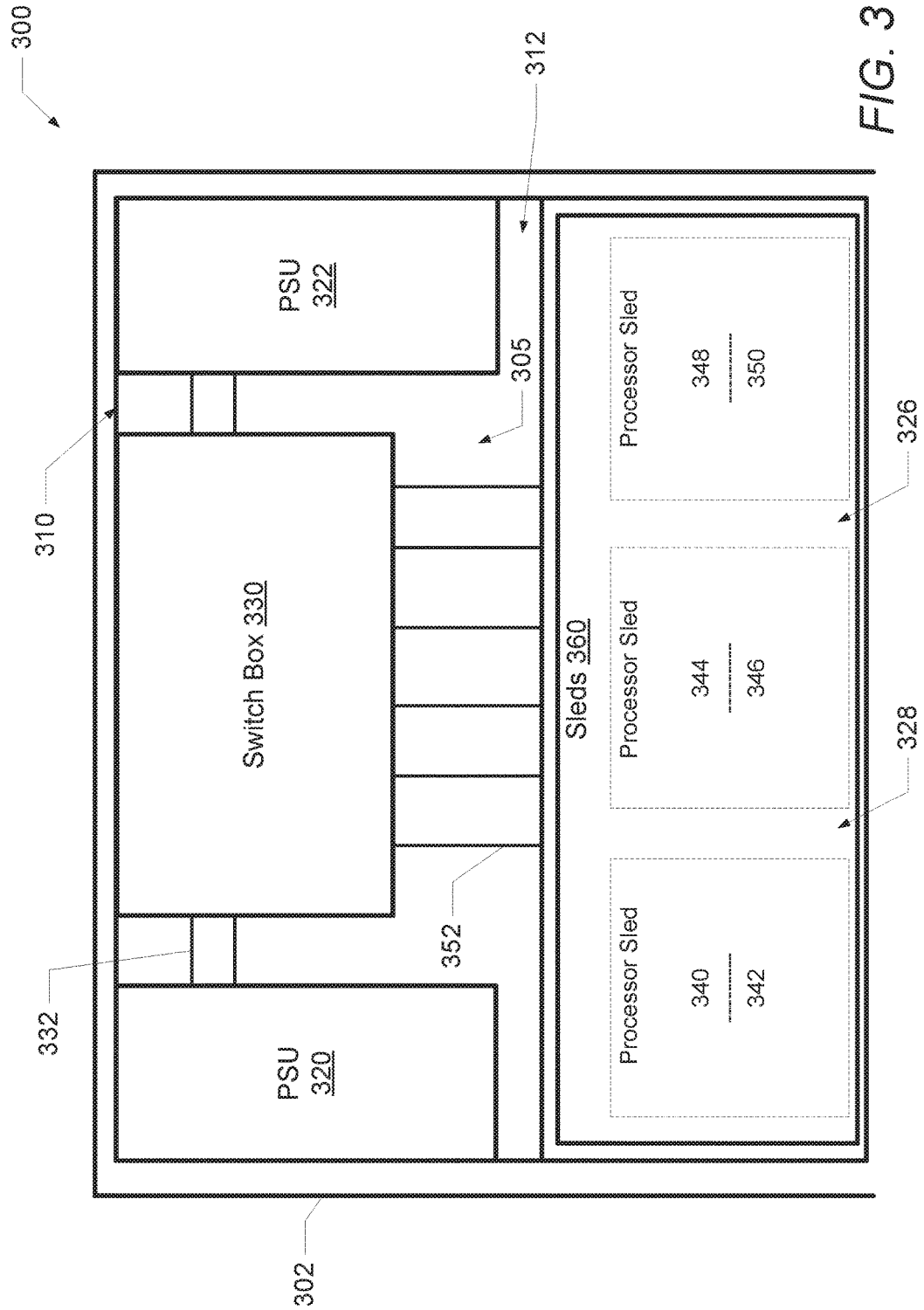

SLED MOUNTED PROCESSING NODES FOR AN INFORMATION HANDLING SYSTEM

BACKGROUND

1. Technical Field

The present disclosure generally relates to information handling systems and in particular to sled mounted processing nodes for an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A cluster computer is a set of loosely or tightly connected computers that work together so that, in many respects, they can be viewed as a single system. Cluster computers are frequently within a rack. Providing power management and cooling to such an information handling system is important to prevent loss of data and to maintain system reliability. Of even greater importance is the ability to provide high density computing power within the limited space provided by a rack IHS. This high density of computing power in a small space has resulted in some applications that have such high power and cooling requirements that it is not possible to use all of the computing spaces within a rack.

BRIEF SUMMARY

Disclosed are a processing node sled assembly providing multiple printed circuit boards arranged to provide higher processor density, while having localized cooling mechanisms to support removal of the added heat generated due to the higher processor density.

According to one embodiment, a sled mounted processing node apparatus is provided that includes a first processing node sled. A first printed circuit board (PCB) is coupled to the processing node sled. A first set of electronic components, including at least one processor, are coupled to the PCB. The apparatus includes a second processing node sled having a second PCB connected to the second processing node sled and a second set of electronic components, including at least one second processor, coupled to the second PCB. The at least one processor and second processor collectively enables increased processing density within a single server chassis. Each processing node sled is configured to be slideably inserted and removed from a server chassis that accommodates concurrent insertion of multiple processing node sleds in respective sled bays of the server chassis.

According to another embodiment, a multi-processor processing node apparatus comprises a first processing node (PN) sled that is configured to be slideably inserted and removed from a larger server chassis module that supports multiple PN sleds. The PN sled includes a first processing node having (i) a first printed circuit board (PCB) connected to the first processing node sled and (ii) a first set of electronic components including at least one processor coupled to the first PCB. The PN sled also includes a cold plate in thermal connection to the heat generating components of the PCB to enable localized cooling of the PN sled.

According to an additional embodiment, an information handling system (IHS) comprises at least one processing node sled including at least one processing node. The processing node sled is configured to be slideably inserted and removed from a server chassis designed for utilization within a rack IHS. The server chassis includes a plurality of sled bays to support insertion of a plurality of PH sleds. Each processing node sled includes (i) at least one printed circuit board (PCB) coupled to the processing node sled, (ii) a plurality of electronic components, including at least one processor, collectively providing increase processing density within a server chassis of the rack IHS CBs, and (iii) a cold plate in thermal connection to heat generating electronic components of the PCB to enable localized cooling of the PN sled.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 provides a top view of a modular chassis having inserted IT gear, in accordance with one embodiment;

DETAILED DESCRIPTION

Figure 1:
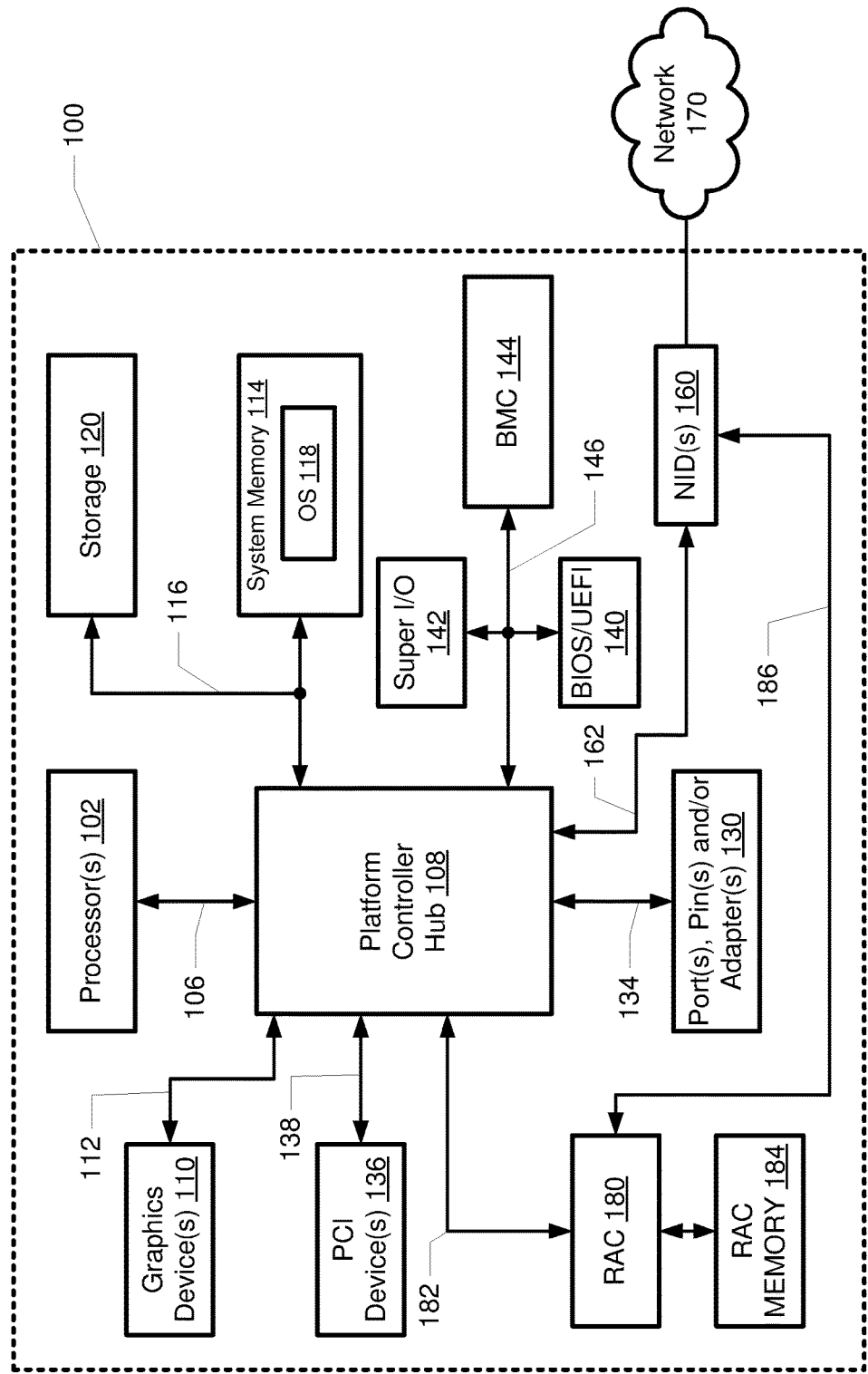
FIG. 1 illustrates one example of an IHS within which various aspects of the disclosure can be implemented, according to one or more embodiments.

The illustrative embodiments provide a processing node sled configuration for use within a rack information handling system and an information handling system having sled mounted processing nodes that provide increased processing density and cooling efficiency. Also disclosed is a server chassis designed for insertion within a rack information handling system, where the server chassis is configured to support insertion of multiple processor node (PN) sleds, thus providing higher processor density per unit server.

According to one embodiment, a server chassis of a rack information handling system (IHS) is designed with multiple bays for receiving a plurality of sled mounted processing nodes in a configuration that provides increased processing density and cooling efficiency per unit server. A sled mounted processing node includes a processing node sled. A printed circuit board (PCB) having a set of electronic components, including at least one processor, is coupled to the processing node sled to enable increased processing density within a single sled. A cold plate is coupled to the heat generating components of the PCB to enable enhanced localized cooling for the increased processing density within the single sled. The processing node sled is configured to be slideably inserted and removed from a server chassis that accommodates concurrent insertion of multiple processing node sleds in respective sled bays of the server chassis.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, an example of an IHS 100 is shown. IHS 100 includes one or more processor(s) 102. In various embodiments, IHS 100 may be a single-processor system including one processor 102, or a multi-processor system including two or more processor(s) 102 (e.g., two, four, eight, or any other suitable number). Processor(s) 102 may include any processor capable of executing program instructions. In an embodiment, IHS 100 includes a motherboard, which is configured to provide structural support, power, and electrical connectivity between the various structural and functional components making up HIS 100. Such a motherboard may include multiple connector sockets in various configurations, adapted to receive pluggable circuit cards, component chip packages, etc.

On the example motherboard within IHS 100, processor(s) 102 are coupled to platform controller hub (PCH) or chipset 108 via front-side bus 106. PCH 108 may be configured to coordinate I/O traffic between processor(s) 102 and other components. For example, in this particular implementation, PCH 108 is coupled to graphics device(s) 110 (e.g., one or more video cards or adaptors, etc.) via a graphics bus 112 (e.g., an Accelerated Graphics Port or AGP bus, a Peripheral Component Interconnect (PCI) bus, etc.). PCH 108 is also coupled to system memory 114 via memory bus 116. Memory 114 may be configured to store program instructions such as operating system (OS) 118 and/or data accessible by processor(s) 102. In various embodiments, memory 114 may be implemented using any suitable memory technology, such as static RAM (SRAM), synchronous dynamic RAM (SDRAM), nonvolatile/Flash-type memory, or any other type of memory.

Also coupled to memory bus 116 is a storage device or storage 120, within which can be stored one or more software and/or firmware modules and/or data (not specifically shown). In one embodiment, storage 120 can be a hard drive or a solid state drive. The one or more software and/or firmware modules within storage 120 can be loaded into system memory 114 during operation of IHS 100. In one embodiment, OS 118 can support multiple processing nodes of IHS 100.

PCH 108 is also coupled to one or more PCI devices 136 (e.g., modems, network cards, sound cards, video cards, shared memory etc.) via a PCI bus 138. PCH 108 is further coupled to port(s), pin(s), and/or adapter(s) 130 over a bus 134. Generally, PCH 108 may be configured to handle various I/O operations, and PCH 108 may provide interfaces such as, for instance, Universal Serial Bus (USB), audio, serial, parallel, Ethernet, etc., via port(s), pin(s), and/or adapter(s) 130 over bus 134. For example, PCH 108 may be configured to allow data to be exchanged between IHS 100 and other devices, such as other IHSs attached to a network. In various embodiments, PCH 108 may support communication via wired or wireless general data networks, such as any suitable type of Ethernet network, via telecommunications/telephony networks, such as analog voice networks or digital fiber communications networks, via storage area networks such as Fiber Channel SANs, or via any other suitable type of network and/or protocol.

PCH 108 may also enable connection to one or more input devices, such as keyboards, keypads, touch screens, scanning devices, voice or optical recognition devices, or any other devices suitable for entering or retrieving data. Multiple I/O devices may be present in IHS 100. In some embodiments, I/O devices may be separate from IHS 100 and may interact with IHS 100 through a wired or wireless connection. PCH 108 is also coupled to basic input output system/unified extensible firmware interface (BIOS/UEFI) 140, super I/O Controller 142, and baseboard management controller (BMC) 144 via Low Pin Count (LPC) bus 146.

BIOS/UEFI 140 allows processor(s) 102 to initialize and test other hardware components and/or to load an OS 118 onto IHS 100. As such, (BIOS/UEFI) 140 may include a firmware interface that allows processor(s) 102 to load and execute certain firmware, as described in more detail below. In some cases, such firmware may include program code that is compatible with the Unified Extensible Firmware Interface (UEFI) specification, although other types of firmware may be used.

BMC 144 may include non-volatile memory having program instructions stored thereon that are usable by processors(s) 102 to enable remote management of IHS 100. For example, BMC 144 may enable a user to discover, configure, and manage BMC 144, setup configuration options, resolve and administer hardware or software problems, etc. Additionally or alternatively, BMC 144 may include one or more BMC firmware volumes. Each volume includes one or more firmware files used by the BIOS' firmware interface to initialize and test components of IHS 100. Super I/O Controller 142 combines interfaces for a variety of lower bandwidth or low data rate devices. Those devices may include, for example, floppy disks, parallel ports, a keyboard and mouse and other devices.

In some cases, IHS 100 may be configured to access different types of computer-accessible media, separate from memory 110. Generally speaking, a computer-accessible memory device may include any tangible, non-transitory storage media or memory media such as electronic, magnetic, or optical media (e.g., magnetic disk, a hard drive, a CD/DVD-ROM, a Flash memory, etc.) coupled to IHS 100 via PCH 108.

IHS 100 further comprises one or more network interface devices (NID(s)) 160 coupled to PCH 108 via a PCI bus 162. NID(s) 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID(s) 160 enables IHS 100 to be connected to these other devices. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

IHS 100 further includes remote access controller (RAC) 180 coupled via a PCI bus 182 to PCH 108. RAC 180 provides management functions that allow an administrator to deploy, monitor, manage, configure, update, troubleshoot and remediate IHS 100. RAC 180 is also coupled to RAC memory 184. In one embodiment, RAC memory 184 can be shared with processor(s) 102. RAC 180 is also communicatively coupled to NID(s) 160 via a sideband bus 186.

RAC 180 monitors and controls the operation of IHS 100 and other systems and devices communicatively coupled to IHS 100. RAC 180 can also perform configuration and remote control of other connected IHSs. Certain software and/or firmware modules stored in RAC memory 184 can be executed by RAC 180. Processor(s) 102 and RAC 180 include specific firmware that enables processor(s) 102 and RAC 180 to perform the various functions described herein.

A person of ordinary skill in the art will appreciate that IHS 100 is merely illustrative and is not intended to limit the scope of the disclosure described herein. In particular, any computer system and/or device may include any combination of hardware or software capable of performing certain operations described herein. For instance, although IHS 100 is illustrated following a first type architecture, various systems and methods described herein may be adapted to work with any other architecture having a different chipset and/or RAC configuration. In addition, the operations performed by the illustrated components may, in some embodiments, be performed by fewer components or distributed across additional components. Similarly, in other embodiments, the operations of some of the illustrated components may not be performed and/or other additional operations may be available.

In other implementations, one or more of the devices or components shown in FIG. 1 may be absent, or one or more other components may be added. Accordingly, systems and methods described herein may be implemented or executed with other computer system configurations.

Figure 2:
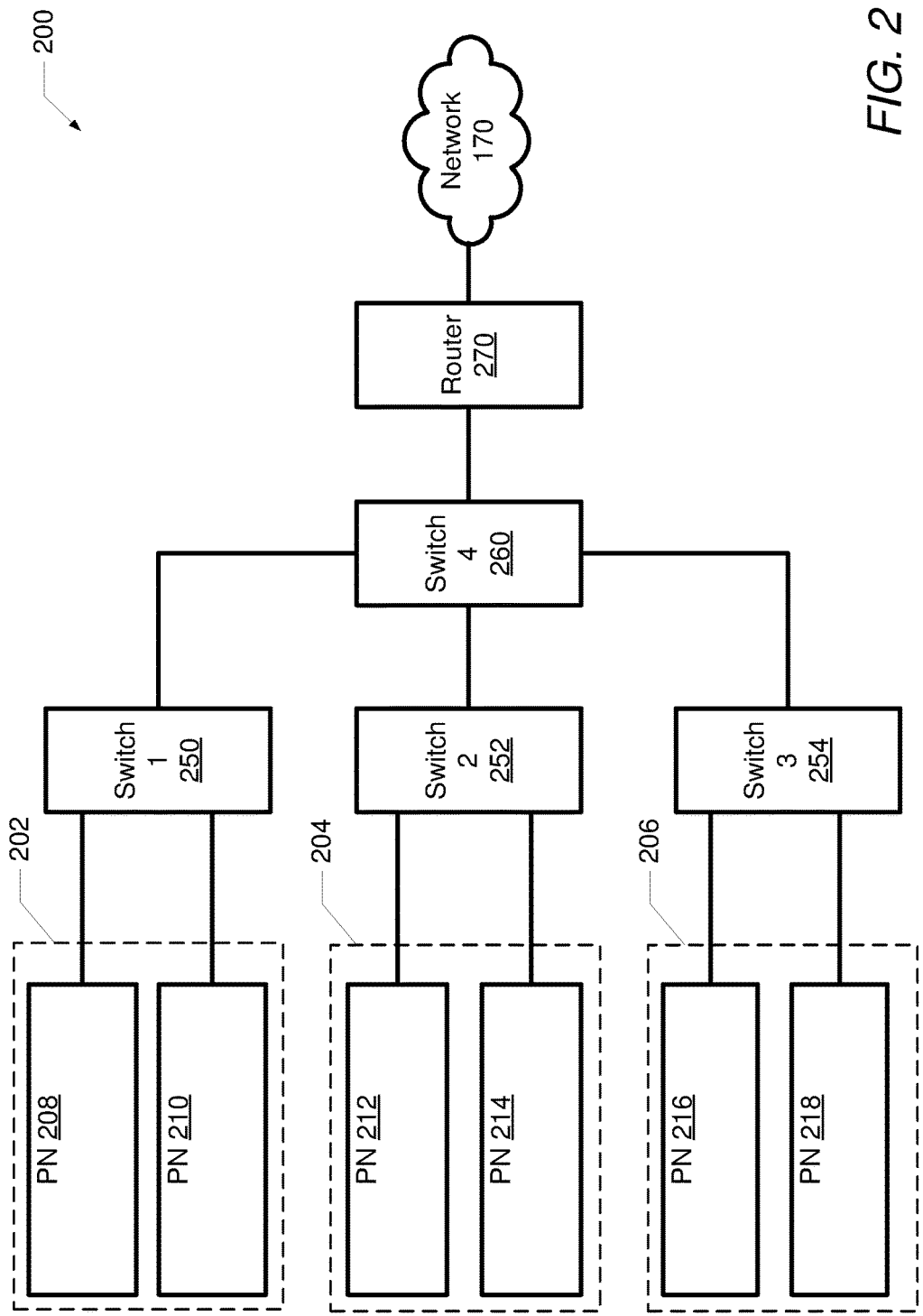
FIG. 2 illustrates an example networked computing environment, including multiple IHSs, switches and a router in communication with/via a network, according to one or more embodiments.

Referring to FIG. 2, a distributed, networked computing environment or system 200 is shown. In the description of the following figures, reference is also made to specific components illustrated within each of the preceding figures. Networked computing system 200 includes several computing or processing nodes (PNs) 208, 210, 212, 214, 216 and 218. In one embodiment, each PN 208-218 can have the same architecture and components of IHS 100. In another embodiment, one or more of PNs 208-218 can have a reduced or different set of components from IHS 100.

Networked computing system 200 also includes a plurality of switches and at least one router that collectively enable interconnection and communication between various PNs 208-218 and other functional components within networked computing system 200. Switches 250-260 are devices that connect PNs together on a computer network using packet switching to receive, process, and forward data from an originating device to the destination device. Router 270 is a networking device that forwards data packets between computer networks. PN 208 and 210 are communicatively coupled to switch 1 250. PN 212 and 214 are communicatively coupled to switch 2 252. PN 216 and 218 are communicatively coupled to switch 3 254. Switch 1 250, switch 2 252 and switch 3 254 are communicatively coupled to switch 4 260. Switch 4 260 is communicatively coupled to router 270. Router 270 is communicatively coupled to network 170.

According to one embodiment, networked computing system 200 can represent an example cluster computer. A cluster computer is a set of loosely or tightly connected computers that work together, typically within a rack, so that, in many respects, they can be viewed as a single system. In one embodiment, PNs 208-218 can be viewed as a cluster computer. As computer technology rapidly evolves and faster computing devices are developed, cluster computers face periodic forced obsolescence due to the increasing efficiency of newer and more efficient computing solutions. Replacing the entire computing system causes a corresponding large capital expenditure about every 18-24 months and periodically disrupts a portion of the computing system operation as new systems are installed. The components of processing nodes that become obsolete the fastest are the central processing unit (CPU), graphics processing unit (GPU), and memory. These components are not easily separated from the other highly customized components such as power supplies and switches contained in the IHS rack. Aspect of the current disclosure find applicability to cluster computers, where a legacy single processor node can be replaced with a high processing capacity server sled that includes multiple individual processor sleds, each having specific configuration for higher processing density and enhanced cooling capacity.

With reference now to FIG. 3, one embodiment of a modular chassis 300 is shown. In one embodiment, chassis 300 can be a server chassis configured to be mounted in a rack 302 as a rack mounted IHS. Chassis 300 includes an outer housing 310 that defines an interior space or cavity 312. Various information technology (IT) gear 305 can be mounted within chassis 300. IT gear 305 can include several power supply units (PSU) 320 and 322, which can be mounted within interior space 312. A switch box 330 is mounted in interior space 312. Switch box 330 contains switches 250-260. Several server sleds 360 can be mounted within interior space 312. Server sled 360 can include individual processing node (PN) or processor sleds 340, 342, 344, 346, 348 and 350. Power cables 332 route electrical power from the PSUs to switch box 330. Data and power cables 352 route data signals to and from server sled 360, and specifically individual processor sleds 340, 342, 344, 346, 348 and 350, within chassis 300 and supply electrical power to the server sleds 360, and specifically individual processor sleds 340, 342, 344, 346, 348 and 350, respectively. In one embodiment, data and power cables 352 can be Ethernet cables that utilize power over Ethernet (POE). POE describes several standardized systems which pass electrical power along with data on twisted pair Ethernet cables, allowing a single cable to provide both data connection and electrical power to connected devices.

Figure 4A:
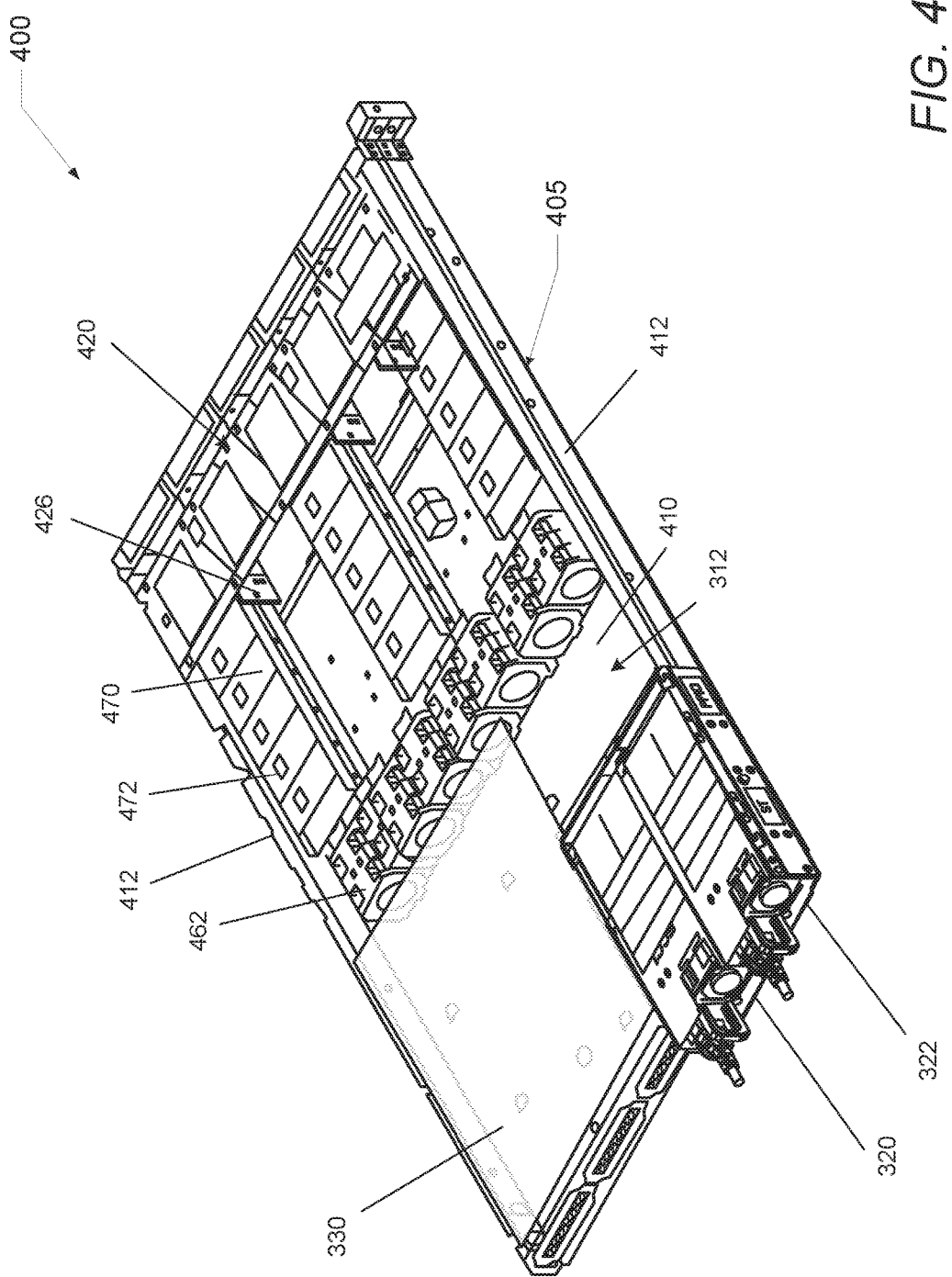
FIG. 4A is an assembled rear perspective view of a modular chassis having inserted processing node (PN) sleds, in accordance with one embodiment.
Figure 4B:
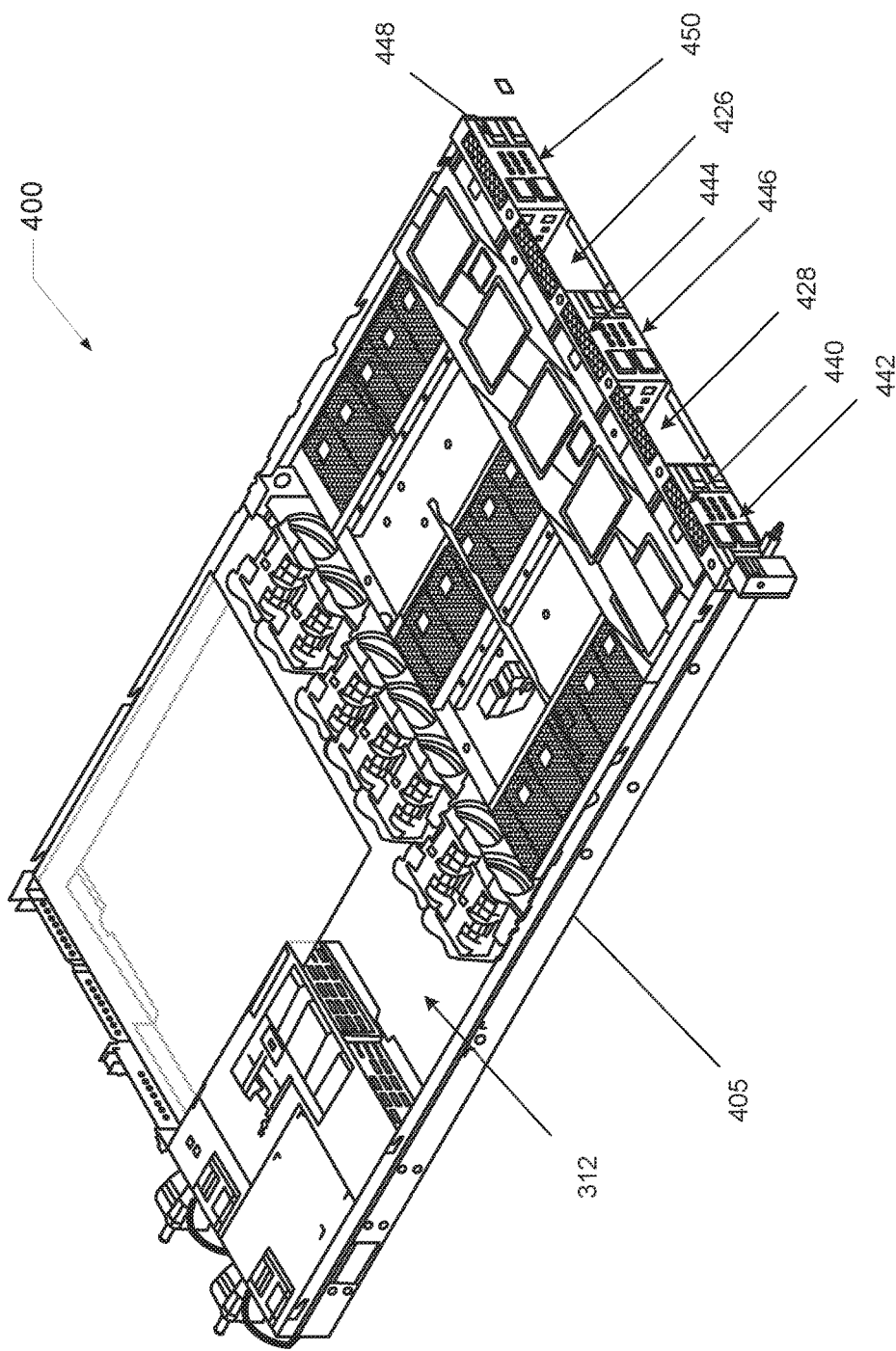
FIG. 4B is an assembled front perspective view of a modular chassis having inserted PN sleds, in accordance with one embodiment.
Figure 4C:
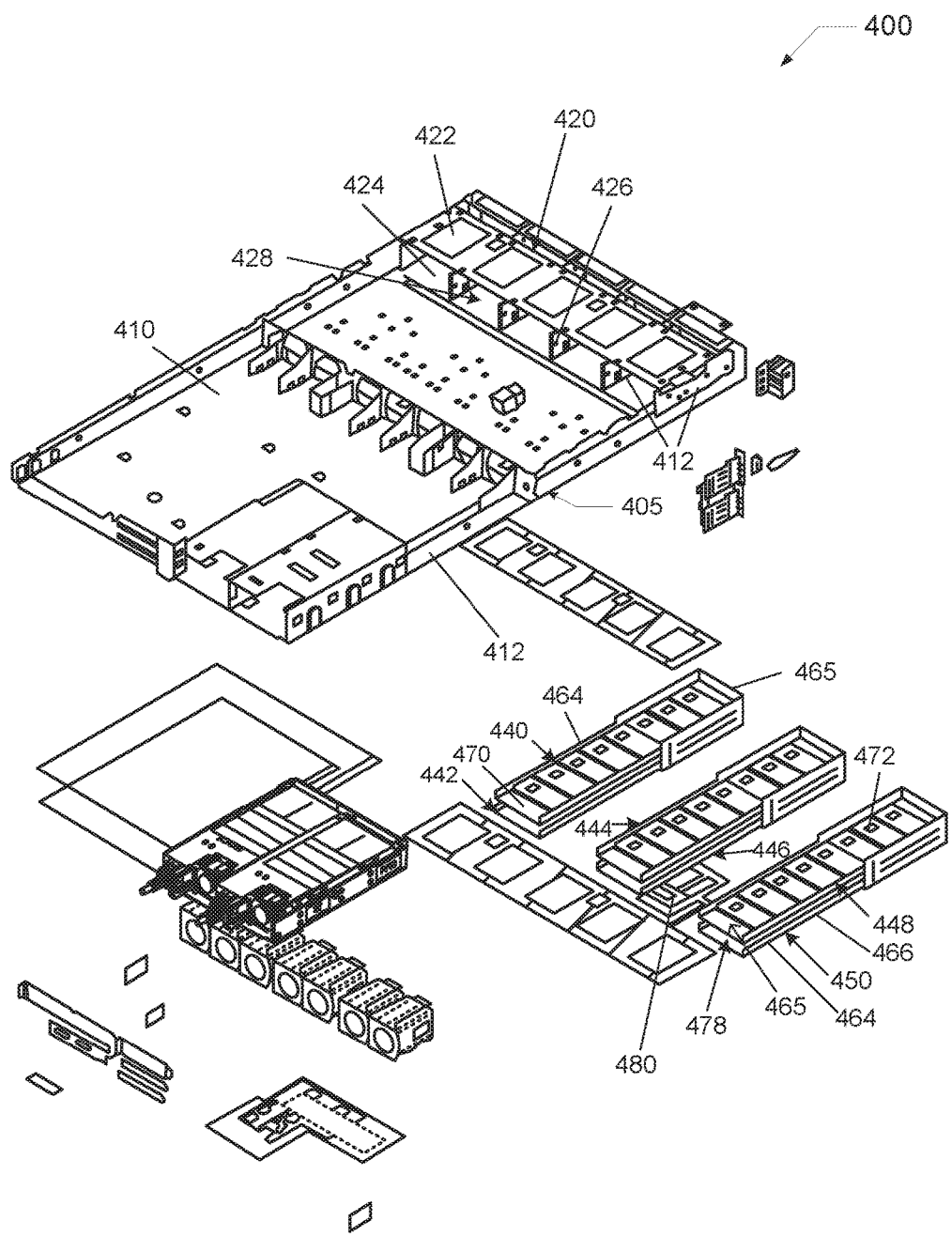
FIG. 4C is an exploded view of the modular chassis of FIG. 4A, in accordance with one embodiment.
Figure 4D:
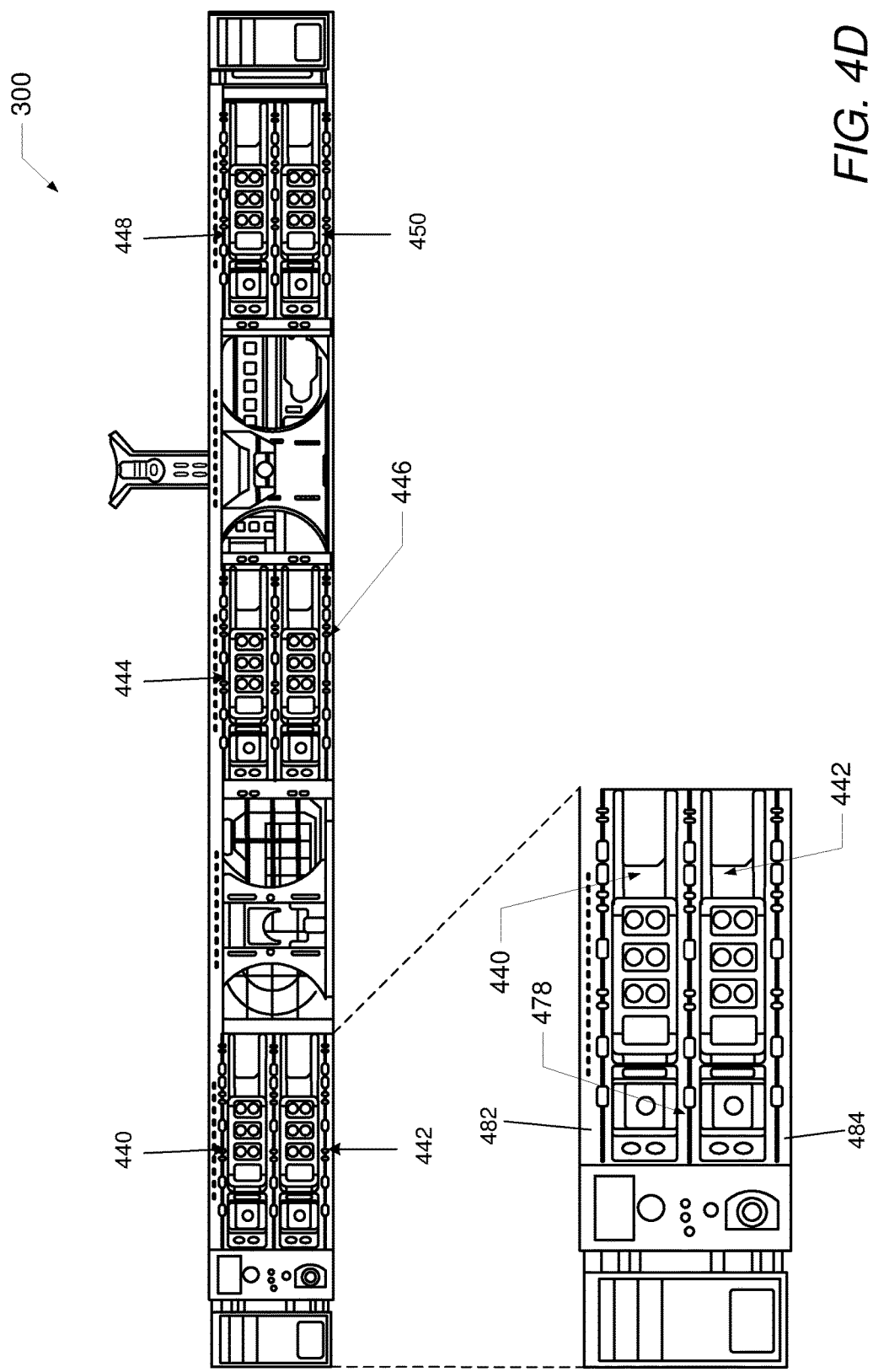
FIG. 4D is a front view of a modular chassis having inserted PN sleds, with an enlarged view of a vertically-stacked pair of PN sleds in accordance with one embodiment.

Referring to FIGS. 4A-D, a three dimensional, exploded view of modular chassis 400, representing a server chassis, is shown. Modular chassis 400 includes outer housing 405. Outer housing 405 has a bottom panel 410 and opposed side walls 412 separated by bottom panel 410. Interior space 312 is defined by bottom panel 410 and opposed side walls 412. A sled frame 420 is mounted within housing 405. Sled frame 420 includes top wall 422, bottom wall 424 and support rails 426. Support rails 426 define several sleds bays 428 within sled frame 420 for housing respective processing node (PN) sleds that include pairs of vertically stacked processing nodes 440 and 442, 444 and 446, and 448 and 450 (collectively processing nodes 440-450). In one embodiment, chassis 400 can be a 1 rack unit (1U) chassis that is either 19 or 23-inches in width and 1.75 inches in height and that includes multiple sled bays. FIG. 4C includes a view that can represent another embodiment of chassis 300 with processing node sled pairs (i.e. 440-442) that can be inserted into the sled frame 420. Each of the sled pairs can be retained by a U-shaped support member 465 for simultaneous insertion into sled frame 420.

In an embodiment, each sled bay 428 can receive one of PN sleds 464. PN sleds 464 are arranged in modular chassis 400 as pairs of spaced-apart and stacked processing nodes, where both processing node of each pair are stacked vertically, relative to each other. In the presented example, processing nodes 440 and 442 form one pair of stacked nodes in sled frame 420. processing nodes 444 and 446 form another pair of stacked nodes in sled frame 420. Processing nodes 448 and 450 form one more pair of stacked nodes in sled frame 420. Thus, as shown, each vertically stacked pair of processing nodes 440-450 are mounted in a respective sled bay 428. While six processing nodes are shown, arranged as three vertically-stacked pairs of processing nodes, more or fewer PN sleds can be mounted in modular chassis 300, in alternate embodiments. The support rails 426 can include a frame retention mechanism or feature 460 that allows the sleds to be retained to and released from the sled frame 420. Several cooling devices 462, such as fans, can be mounted to bottom panel 410 within interior space 312.

Each of the pairs of processing nodes 440-450 or single processing nodes sleds are inserted within sled case 464, having sled retention mechanisms or features 466. Each individual processing node sled includes printed circuit board (PCB) 470. Sled retention features 466 are mounted to sled case 464 and allow the sleds to be retained to and released from sled frame 420. Sled case 464 defines a receptacle 465, and PCB 470 is mounted to sled case 464 within receptacle 465. PCB 470 contains electronic components 472 that implement one or more processing nodes such as PNs 208-218 (FIG. 2). In one embodiment, PCB 470 can contain the electronic components 472 for eight processor chips or systems on chip.

The frame retention features 460 and the sled retention features 466 mate with each other to allow each of the PN sleds to be slid in and out of modular chassis 400. The sled frame 420 and frame retention features 460 are designed such that each vertically oriented pair of processing nodes (i.e., first pair of processing nodes 440 and 442, second pair of processing nodes 444 and 446, and third pair of processing nodes 448 and 450) are stacked and separated by an air space or gap 478 that allows cooling air to flow between the processing nodes of the pair. The air channel 478 is defined by spaced PN sleds such as PN sleds 440 and 442. The air channel allowing cooling air to flow over the PCBs in the PN node sleds. In one embodiment, as illustrated within the expanded view, additional cooling air channel 482 can be provided above each of the upper sleds (e.g., sled 440 in FIG. 4D) and additional air channel 484 can be provided below each of the lower sleds (e.g., sled 442 in FIG. 4D). In this embodiment, cooling devices 462 (such as an air mover or fan located within or behind the server chassis) can cause cooling air to flow through air channel 478, 482 and 484 in order to cool the electronic components within the respective pair of processing nodes. According to one embodiment, each sled case 464 retains or holds a first PCB (in lieu of an encased PN sled 440) and attached cold plate (not specifically shown) in a spaced apart relationship from a second PCB (in lieu of the vertically stacked PN sled 440) and attached cold plate, defining an air channel 478 there between. The stacked and spaced apart configuration of the pairs of processing nodes with PN sleds within chassis 300 allows for increased processing density within a single modular chassis, while providing the required enhanced cooling efficiency to support dissipation of the additional heat generated by the increased processing power. Electronic connectors 480 are provided from processing nodes of each of sled cases 464. One end of connector 480 attaches to at least one of data and power cables 352 (FIG. 3) and the other end of connector 480 is connected to functional components located within/on PCB 470.

Figure 5:
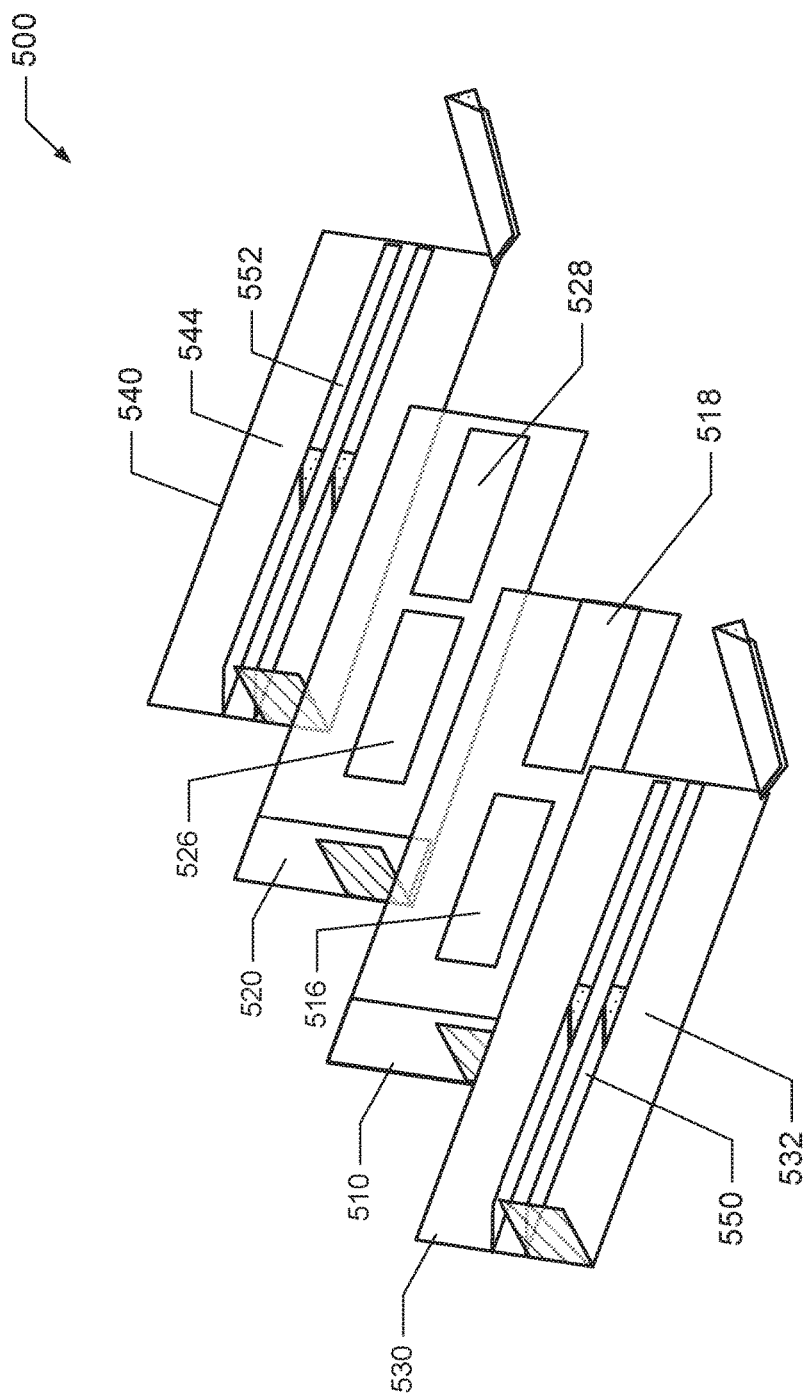
FIG. 5 is an exploded view of a pairing of two adjacent PN assemblies, each PN assembly having a printed circuit board and cold plate, in accordance with one embodiment.
Figure 6:
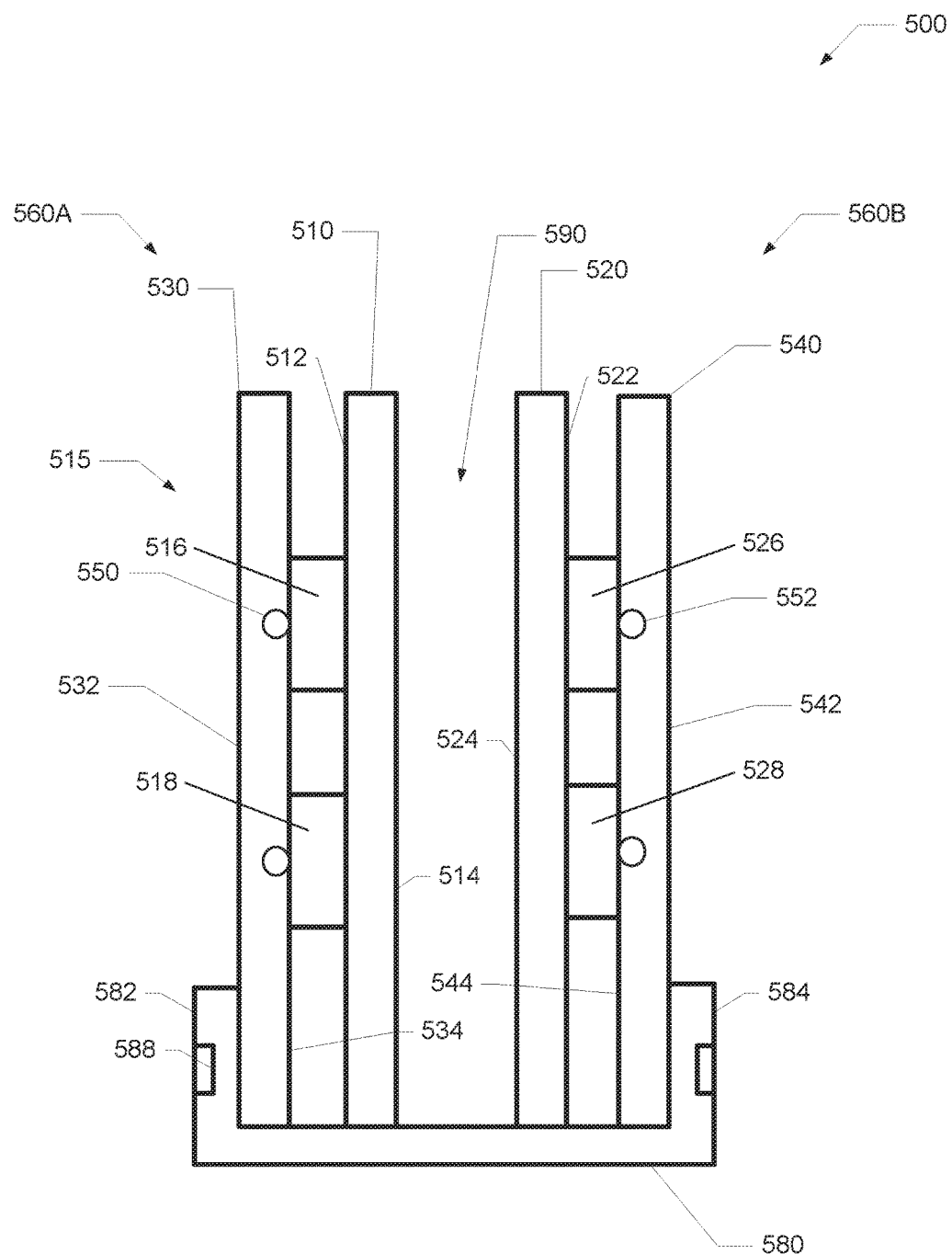
FIG. 6 is a side view of one example of the assembled pairing of the two adjacent PN assemblies of FIG. 5, each configured with respective printed circuit board and cold plate, in accordance with one embodiment.

Referring to FIGS. 5 and 6, there are presented two different views of an embodiment of a pairing of PNs, such as any one pair of the vertically stacked pairs of processing nodes 440-450 of FIG. 4. FIG. 5 specifically provides an exploded view of a pairing of two adjacent PN assemblies, each PN assembly having a printed circuit board and attached cold plate, in accordance with one embodiment. FIG. 6 then provides a side view of one example of the assembled pairing of the two adjacent PN assemblies of FIG. 5, each configured with respective printed circuit board and attached cold plates, and held within a casing, in accordance with one embodiment. The casing can be an individual casing for each PN (as illustrated by the separate PN sleds of FIG. 4D) or a single casing enclosing the pair of assembled PNs, in an alternate embodiment. The pair of PNs assemblies of FIGS. 5 and 6 are referred to as PN pair 500. In one embodiment, PN pair 500 represent any one the pairs of PNs 440-450 in FIGS. 4A-4D. PN pair 500 comprises printed circuit boards (PCBs) 510 and 520, cold plates 530 and 540 and sled casing or case 580. PCB 510 has opposed sides or surfaces 512 and 514. Electronic components 515, such as a processor 516 and memory 518, can be mounted to surface 512. Cold plate 530 has opposed sides or surfaces 532 and 534. Heat pipes 550 are coupled between processor 516 and memory 518 and cold plate 530. Heat pipes 550 are a heat-transfer device that combines the principles of both thermal conductivity and phase transition to manage the transfer of heat between two interfaces. In this example, heat transfer occurs between processor 516 and memory 518 and cold plate 530. Heat pipes 550 are thermally coupled or in thermal communication with cold plate 530 and the components requiring cooling (i.e., processor 516 and memory 518). As provided herein, the term thermally coupled refers to the placement or location of the specific portions of heat pipes 550 proximate/adjacent to, in direct physical contact with, or inside of the component from/to which heat transfer is desired. In thermal communication, heat is conductively transferred between two devices from the high temperature device to the low temperature device across a temperature gradient. The combination of PCB 510, cold plate 530 and heat pipe 550 form an assembly 560A.

Similarly, PCB 520 has opposed sides or surfaces 522 and 524. Electronic components 515 such as a processor 526 and memory 528 can be mounted to surface 522. Cold plate 540 has opposed sides or surfaces 542 and 544. Heat pipes 552 are coupled between processor 526 and memory 528 and cold plate 540. Heat pipes 552 are thermally coupled or in thermal communication with cold plate 540 and the components requiring cooling (i.e. processor 526 and memory 528). Cold plates 530 and 540 and heat pipes 550 and 552 can be formed from a variety of materials that support or enable heat conduction, including but not limited to aluminum or copper alloys. The combination of PCB 520, cold plate 540, and heat pipe 552 form assembly 560B.

As illustrated by FIG. 6, sled case 580 retains or holds assembly 560A of PCB 510 and cold plate 530 in a spaced apart relationship from assembly 560B of PCB 520 and cold plate 540, defining an air channel 590 there between. Cooling air can flow within air channel 590 providing cooling to PCBs 510 and 520. In the provided embodiment, the combination of PCB 510 and cold plate 530 (i.e., assembly 560A) is attached to one side 582 of sled case 580 and the combination of PCB 520 and cold plate 540 (i.e., assembly 560B) is attached to the other side 584 of sled case 580. Sled retention features 588 are mounted to each of sides 582 and 584. Sled retention features 588 mate with frame retention features 460 and allow the PN sleds to be selectively retained to and released from the sled frame 420. In one embodiment, surfaces 532 and 542 form at least a portion of the outer surfaces of the sled retaining PN pair 500.

According to one embodiment of the present disclosure, a server chassis of a rack information handling system (IHS) is designed with multiple bays for receiving a plurality of sled mounted processing nodes in a configuration that provides increased processing density and cooling efficiency per unit server. The server chassis includes at least one processing node sled having at least one processing node. The processing node sled is configured to be slideably inserted and removed from the server chassis. The processing node sled includes several printed circuit boards (PCBs) secured within the processing node sled. Each PCB includes electronic components, including at least one processor, and the processing node sled thus provides increased processing density within the server chassis and by extension the rack IHS.

Additionally, according to one embodiment, a sled mounted processing node apparatus includes: a first processing node sled; a first printed circuit board (PCB) connected to the first processing node sled; and a first set of electronic components, including at least one processor, coupled to the first PCB. The first processing node sled is configured to be slideably inserted and removed from a server chassis that accommodates concurrent insertion of multiple processing node sleds in respective sled bays of the server chassis. The processing node sled also includes: a second processing node sled; a second PCB connected to the second processing node sled; and a second set of electronic components, including at least one second processor, coupled to the second PCB, wherein the at least one processor and the at least one second processor collectively enables increased processing density within a single server chassis.

Figure 7:
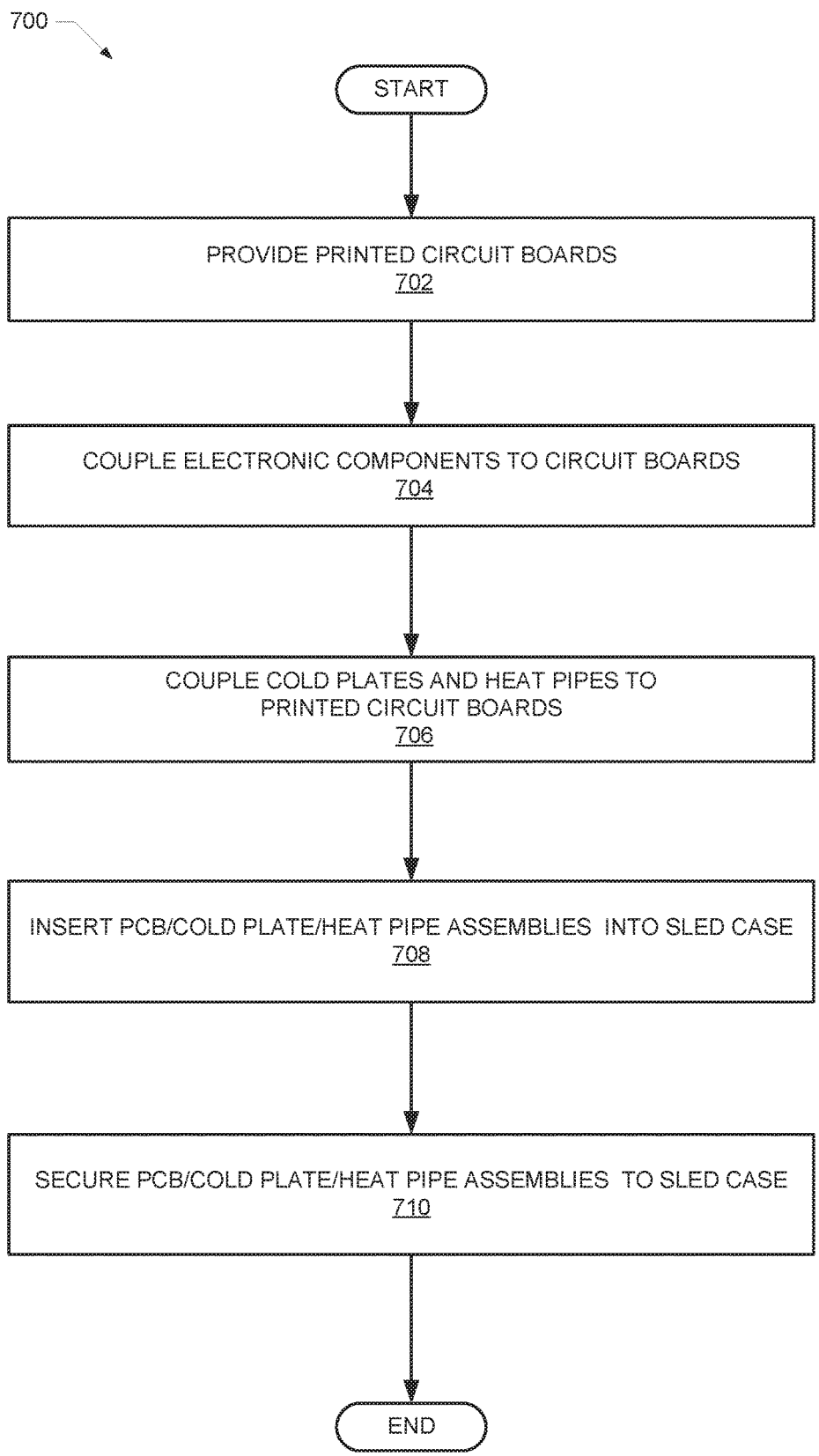
FIG. 7 is a flow chart illustrating one example of a method for manufacturing a processing node sled in accordance with one embodiment.

FIG. 7 illustrates a flowchart of an exemplary method for manufacturing a PN sled with increased processing density and cooling efficiency. Generally, method 700 represents a method to manufacture processing node sled 440 or 500. The description of method 700 is provided with general reference to the specific components illustrated within the preceding FIGS. 1-7.

With specific reference to FIG. 7, method 700 begins at the start block and proceeds to block 702 where PCBs 510 and 520 are provided. At block 704, a first set of electronic components 515 are attached or coupled to PCB 510 and a second set of the electronic components 515 are coupled to PCB 520. Cold plate 530 and heat pipe 550 are coupled to PCB 510 forming assembly 560A, and cold plate 540 and heat pipe 552 are coupled to PCB 520 forming assembly 560B (block 706). Assemblies 560A and 560B are inserted into sled case 580 (block 708). At block 710, the assemblies 560A and 560B are secured or attached to the sled case 580. Method 700 then ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A sled mounted processing node apparatus comprising:
a first processing node sled;
a plurality of printed circuit boards (PCBs) coupled to the first processing node sled to increase processing density within a rack HIS, the plurality of PCBS comprising a first printed circuit board (PCB) connected to the first processing node sled; and
a first set of electronic components, including at least one processor, coupled to the first PCB;
wherein the first processing node sled is configured to be slideably inserted and removed from a server chassis that accommodates concurrent insertion of multiple processing node sleds in respective sled bays of the server chassis.

2. The processing node apparatus of claim 1 further comprising:
a second processing node sled;
a second PCB connected to the second processing node sled; and
a second set of electronic components, including at least one second processor, coupled to the second PCB, wherein the at least one processor and the at least one second processor collectively enables increased processing density within a single server chassis.

3. The processing node apparatus of claim 2, wherein the chassis is a 1U chassis that includes multiple sled bays, the first and second processing node sleds slideably insertable and removable from the same sled bay in a vertically stacked arrangement.

4. The processing node apparatus of claim 2, wherein:
the second processing node sled is configured to be slideably inserted and removed from the chassis;
the first and second processing node sleds are held in the chassis in a spaced-apart configuration; and
an air channel is defined by the spaced apart first and second processing node sleds, the air channel allowing cooling air to flow over the first and second PCBs.

5. The processing node apparatus of claim 1, further comprising:
a first cold plate coupled to the first PCB to provide localized cooling for the first set of electronic components;
at least one heat pipe coupled between at least one of the first set of electronic components and the first cold plate;
wherein the first set of electronic components are mounted between the first PCB and the first cold plate.

6. The processing node apparatus of claim 1 wherein: the first processing node sled further includes a sled retention mechanism for retaining the first processing node sled to the chassis; and the sled retention mechanism is dimensioned to mate with a chassis retention mechanism to retain the first processing node sled to the chassis.

7. The processing node apparatus of claim 1 wherein, the processing node sled further comprises a sled case having a receptacle therein, the receptacle receiving the first PCB.

8. A multi-processor processing node apparatus comprising:
a first processing node (PN) sled configured to be slideably inserted and removed from a larger server chassis module that supports multiple PN sleds, the PN sled comprising a first processing node having:
(i) a plurality of printed circuit boards (PCBs) coupled to the processing node sled to increase processing density within the rack HIS, the plurality of processing node sled comprises a first printed circuit board (PCB) connected to the first processing node sled; and
(ii) a first set of electronic components including at least one processor coupled to the first PCB.

9. The processing node apparatus of claim 8, wherein the first PN sled further comprises a second processing node having:
a second PCB connected within the first PN sled; and
a second set of electronic components including at least one second processor coupled to the second PCB;
wherein the first and second processing nodes are held in the PN sled in a spaced-apart and stacked configuration.

10. The processing node apparatus of claim 8, wherein each of the first processing node and the second processing node includes a corresponding cold plate coupled to the first PCB and the second PCB to provide cooling, respectively, for the first set of electronic components and the second set of electronic components.

11. An information handling system (IHS) comprising:
at least one processing node sled having at least one processing node, the processing node sled configured to be slideably inserted and removed from a server chassis designed for utilization within a rack IHS and configured with a plurality of sled bays to support insertion of a plurality of PH sleds, the processing node sled including:
(i) a plurality of printed circuit boards (PCBs) coupled to the processing node sled to increase processing density within the rack IHS; and
(ii) a plurality of electronic components, including at least one processor, coupled to each of the plurality of PCBs.

12. The IHS of claim 11, wherein the plurality of PCBs comprises:
a first PCB including a first set of electronic components, including heat generating electronic components; and
a first cold plate coupled to the first PCB to provide localized cooling for the first set of electronic components.

13. The IHS of claim 12, further comprising:
at least one heat pipe coupled between at least one of the first set of electronic components and the first cold plate.

14. The IHS of claim 12, wherein the first set of electronic components are mounted between the first PCB and the first cold plate.

15. The IHS of claim 12, wherein the plurality of PCBs further comprises:
a second PCB including a second set of electronic components, including heat generating electronic components; and
a second cold plate coupled to the second PCB to provide cooling of the second set of electronic components.

16. The IHS of claim 14, wherein the processing node sled includes a sled case, the sled case holding the first cold plate and the first PCB in a juxtaposed position away from the second cold plate and the second PCB.

17. The IHS of claim 15, wherein at least one of the cold plates form at least one outer surface of the sled case.

18. The IHS of claim 14, wherein an air channel is defined by the juxtaposed first and second PCBs, the air channel allowing cooling air to flow over the first and second PCBs.

19. A method for providing a processing node sled that slideably inserts into a server chassis designed for use within a rack information handling system, the method comprising:
providing a first printed circuit board (PCB);
coupling a first set of electronic components to the first PCB;
coupling a first cold plate to the first PCB;
inserting the first PCB and first cold plate into a sled case having external affordances for insertion and retention of the sled case into the server chassis; and
securing the first PCB and first cold plate within the sled case.

20. The method of claim 19, further comprising:
providing a second printed circuit board (PCB);
coupling a second set of electronic components to the second PCB;
coupling a second cold plate to the second PCB;
inserting the second PCB and second cold plate into the sled case; and
securing the second PCB and the second cold plate to the sled case.

* * * * *